United States Patent
Leoni et al.

(10) Patent No.: US 10,224,895 B2
(45) Date of Patent: Mar. 5, 2019

(54) TRANSMISSION LINE TRANSFORMERS

(71) Applicant: Raytheon Company, Waltham, MA (US)

(72) Inventors: Robert E. Leoni, Somerville, MA (US); Thomas B. Reed, North Reading, MA (US); Jason C. Soric, Bedford, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/397,194

(22) Filed: Jan. 3, 2017

(65) Prior Publication Data
US 2018/0191325 A1    Jul. 5, 2018

(51) Int. Cl.
*H01P 3/06* (2006.01)
*H03H 7/30* (2006.01)
*H03H 7/42* (2006.01)
*H01F 27/29* (2006.01)
*H01P 5/12* (2006.01)
*H03H 7/38* (2006.01)

(52) U.S. Cl.
CPC ............... *H03H 7/42* (2013.01); *H01F 27/29* (2013.01); *H01P 3/06* (2013.01); *H01P 5/12* (2013.01); *H03H 7/383* (2013.01); *H03H 7/422* (2013.01)

(58) Field of Classification Search
CPC .................................... H01P 3/06; H03H 7/30
USPC .................................................... 333/26, 125
See application file for complete search history.

(56) References Cited

U.S. PATENT DOCUMENTS

| | | | | |
|---|---|---|---|---|
| 3,103,638 A | * | 9/1963 | Greuet | H03H 7/482 307/12 |
| 3,895,321 A | * | 7/1975 | Seidel | H03H 7/18 333/109 |
| 4,945,321 A | * | 7/1990 | Oppelt | H03H 7/21 333/119 |
| 5,121,090 A | * | 6/1992 | Garuts | H01P 5/10 333/124 |
| 5,977,842 A | * | 11/1999 | Brown | H01P 5/10 333/26 |

(Continued)

OTHER PUBLICATIONS

Notification of Transmittal of the PCT International Search Report and Written Opinion dated Apr. 16, 2018 for PCT Application No. PCT/US2018/012037; 17 pages.

(Continued)

*Primary Examiner* — Dean Takaoka
(74) *Attorney, Agent, or Firm* — Daly, Crowley, Mofford & Durkee, LLP

(57) ABSTRACT

A transmission line transformer having a time delay network having a signal terminal and a pair of output terminals connected to the signal terminal through a corresponding one of a pair of time delay elements, the delay line elements having different time delays. A pair of transmission lines, each one having a pair of electrically coupled elements. A first one of the elements in one of the transmission lines has a first end connected to one of the pair of output terminals. A second one of the elements in such one of the transmission lines has a second end connected to a second end of one of the pair of elements in the other one of the transmission lines. The first one of the pair of elements in the other one of the pair of transmission lines is coupled to a second one of the pair of output terminals.

9 Claims, 12 Drawing Sheets

(56) References Cited

U.S. PATENT DOCUMENTS

| 6,239,671 B1* | 5/2001 | Smith | H03H 7/38 |
| | | | 333/156 |
| 7,884,504 B2* | 2/2011 | Tao | H03K 3/57 |
| | | | 307/106 |
| 2006/0006949 A1 | 1/2006 | Burns et al. | |
| 2010/0019857 A1 | 1/2010 | McMorrow et al. | |

OTHER PUBLICATIONS

Niknejad et al.; Integrated circuit transmission-line transformer power combiner for millimeter-wave applications. Electronics Letters; Mar. 1, 2007; vol. 43 No. 5. 2 pages.

* cited by examiner

TRANSMISSION LINE TRANSFORMERS

TECHNICAL FIELD

This disclosure relates generally to transmission line transformers and more particularly to transmission line transformers for impedance transformation and balun applications.

BACKGROUND

As is known in the art, in many applications it is desired to transform an output impedance from an impedance, $Z_0$ to different impedance $KZ_0$, where K is an integer greater than 1. One device used to perform this impedance transformation is an impedance transformer. One type of impedance transformer uses concepts described in U.S. Pat. No. 2,700,129, inventor G. GUANELLA issued Jan. 18, 1955; sometimes referred to an a Guanella transformer. Another type of impedance transformer is a Ruthroff transformer; see a paper entitled "Some Broad-Band Transformers" by C. L. RUTHROFF, *Proceedings of the IRE* August 1959. The basic building block of the Guandella transformer, shown in FIG. 1A, includes: a pair of transmission lines, $TL_1$, $TL_2$ each one of the transmission lines having a pair of electrically coupled elements, $C_1$, $C_2$ here shown schematically as a pair of mutual inductively coupled coils, $C_1$, $C_2$. A first one of the coupled elements $C_1$ in a first one of the pair of the transmission lines $TL_1$ has a first end $E_1$ connected to an input terminal (IT) of the transformer and a second end $E_2$ coupled to a first output terminal (OT1) of the transformer. A second one of the coupled elements $C_2$ in the first one of the pair of transmission lines $TL_1$ has a first end $E_1$ connected to a reference terminal (RT), here system ground, and a second end $E_2$ connected to a second end $E_2$ of a first one of the pair of coupled elements $C_1$ in a second one of the pair of transmission lines $TL_2$. The first one of the pair of coupled elements $C_1$ in the second one of the pair of transmission lines $TL_2$ has the first end $E_1$ connected to the input terminal (IT). The second one of the elements $C_2$ of the second one of the pair of transmission lines $TL_2$ has a first end $E_1$ connected to the reference terminal RT and a second end $E_2$ connected to a second output terminal OT2, which may be ground potential. Ideally, voltages are applied between the coupled elements $C_1$, $C_2$ in each transmission line $TL_1$, $TL_2$, and the transmission lines $TL_1$, $TL_2$ are interconnected together as shown to transform the input impedance $Z_0$ at the input of the transformer to an output impedance $4Z_0$. It is noted that at high frequency applications, such as in microwave frequency applications, the transmission line $TL_1$ and $TL_2$ may be coaxial transmission lines, as shown in FIG. 1B. Here, the coupling elements $C_1$, and $C_2$ are the inner and outer conductors $C_1$ and $C_2$, respectively, of the coaxial transmission line. Here the input, or first ends $E_1$ of the inner conductors $C_1$ are connected to the input terminal IT and the input, or first, ends $E_1$ of the outer conductors $C_2$ are connected to the reference terminal RT. The output, or second end $E_2$ of the inner conductor $C_1$ of transmission line $TL_1$ is connected to the first output terminal OT1 and the second end $E_2$ of the outer conductor $C_2$ of the second transmission line $TL_2$ is connected to the second output terminal OT2. The second end $E_2$ of the outer conductor $C_2$ of the first transmission line $TL_1$ is connected to the inner conductor $C_1$ of the second transmission line $TL_2$, as shown. It is also noted that the basic building block can be used to form other networks such as baluns.

This basic building block can be multiplied and arranged to provide higher impedance transformers. For example, a 5:1 Guanella impedance transformer providing a $25Z_0$ impedance transformation (where $Z_0$ is the input impedance of the transformer) is shown in FIG. 1C. Here, the Guanella impedance transformer is fed by an amplifier having an output impedance $Z_0$. The output of the amplifier is fed to a 5:1 power divider or splitter having here, in this example, five output coupled to the inputs of five transmission lines, $TL_1$-$TL_5$, respectively, here represented as a pair of mutually inductively coupled coils, $C_1$, $C_2$. More particularly, the upper one of coils, $C_1$, in each one of the transmission lines $TL_1$-$TL_5$ has an input, or first, end $E_1$ connected to the output of the amplifier and the lower one of the coils, $C_2$, in each one of the transmission lines $TL_1$-$TL_5$ has an input, or first, end $E_1$ connected to system ground. The output, or second, end, $E_2$, of the lower coil, $C_2$ in transmission line $TL_1$ is connected to an output end $E_2$ of the upper coil $C_1$ in the next one of the transmission lines, here transmission line $TL_2$; the second end, $E_2$, of the lower coil, $C_2$ in transmission line $TL_2$ is connected to an output end $E_2$ of the upper coil $C_1$ in the next one of transmission line, here transmission line $TL_3$; the second end, $E_2$, of the lower coil, $C_2$ in transmission line $TL_3$ is connected to an output end $E_2$ of the upper coil $C_1$ in the next one of the transmission line, here transmission line $TL_4$; the second end, $E_2$, of the lower coil, $C_2$ in transmission line $TL_4$ is connected to an output end $E_2$ of the upper coil $C_1$ in the next one of the transmission lines, here transmission line $TL_5$. The second output end $E_2$ of the upper coil $C_1$ of transmission line $TL_1$ provides an output terminal of the Guanella impedance transformer and the second output end $E_2$ of the lower coil $C_2$ of transmission line $TL_5$ is connected to system ground, as shown. The five outputs of the power divider are in-phase with each other; that is, they have the same electrical length or time delay from the output of the amplifier to the first end E1 of each the upper one of coils, $C_1$, in each one of the transmission lines $TL_1$-$TL_5$. With such an arrangement, the voltage produced across the outputs ends $E_2$ of coils $C_1$, $C_2$ of each of the transmission lines, $TL_1$-$TL_5$ will be $V_1$-$V_5$, respectively, as indicated. See also, for example: U.S. Pat. No. 7,495,525, issued Feb. 24, 2002, Ilkov et al.; U.S. Pat. No. 6,756,874, Buckles et al., issued Jun. 29, 2004 and, Power Combiners, Impedance Transformers and Directional Couplers by Andrei Grbeanikov, December 2007 *High Frequency Electronics* Copyright © 2007 Summit Technical Media, LLC.

Further, by properly adjusting, or minimizing, the time delays ($T_{D1}$-$T_{D5}$) of the connections (in effect the length of the connectors) between the second ends $E_2$ of one of the transmission lines to second end $E_2$ of the next one of the transmission lines, $V_{IN}=V_1=V_2=V_3=V_4=V_5$ and thus, the output voltage of the transformer is $5*V_{IN}$. The current $I_{IN}$ is split equally among the ends $E_1$ of coils $C_1$ of $TL_1$ thru $TL_5$ such that each current $I_1=I_2=I_3=I_4=I_5=I_{OUT}=I_{IN}/5$. As a result, the output impedance of the amplifier, $Z_{0,IN}=V_{IN}/I_{IN}$, will be transformed by the Guanella impedance transformer to output impedance $Z_{0,OUT}=V_{OUT}/I_{OUT}=(5*V_{IN})/(I_{IN}/5)=25Z_{0,IN}$. In many high frequency applications, such as in microwave applications, the transmission lines are coaxial transmission lines, as shown in FIG. 1D. FIG. 1D shows a coaxial transmission line implantation of the 5:1 Guanella impedance transformer shown in FIG. 1C. In order to improve performance, primarily bandwidth, the coaxial transmission lines are enclosed in a ferrite core, not shown. The real world implementation of the transformer is impaired by certain real-world features in its layout; namely the above-mentioned time delays developed in the lines connecting the transmission line sections to one another.

SUMMARY

In accordance with the disclosure, a transmission line transformer is provided having a time delay network. The time delay network includes a pair of output terminals connected to an input terminal through a corresponding one of a pair of time delay elements, each one of the time delay elements having a different time delay. The transmission line transformer includes a transmission line section having a pair of transmission lines, each one of the transmission lines having a pair of electrically coupled elements. A first one of the electrically coupled elements in each one of the pair of transmission lines has a first end connected to a corresponding one of the pair of output terminals of the time delay network. A second one of the electrically coupled elements in a first one of the transmission lines has a second end connected to a second end of the first one of the pair of electrically coupled elements in a second one of the pair of transmission lines.

In one embodiment, a second end of the first electrically coupled element of said first of the pair of transmission lines is connected to an output of the transmission line transformer.

In one embodiment, one end of the second electrically coupled element in said second one of the pair of transmission lines is connected to a reference terminal of the transmission line transformer.

In one embodiment, a first end of the second electrically coupled element in said first of the pair of transmission lines is connected to the reference terminal.

In one embodiment, a first end of the second element in said second one of the transmission lines is connected to the reference terminal.

In one embodiment, a transmission line transformer is provided having: a time delay network having: a first input terminal connected to a signal terminal; a second input terminal connected to a reference terminal; and a pair of output terminals, each one of the pair of output terminals being connected to the input terminal through a corresponding one of a pair of time delay elements, each one of the time delay elements having a different time delay; a pair of transmission lines, each one of the transmission lines having a pair of electrically coupled elements. A first one of the electrically coupled elements in a first one of the pair of the transmission lines has a first end connected to a first one of the pair of output terminals of the time delay line network and a second end coupled to a first one of the output terminals of the transmission line transformer. A second one of the electrically coupled elements in the first one of the pair of transmission lines has a first end connected to the reference terminal and a second end connected to a second end of a first one of the pair of electrically coupled elements in a second one of the pair of transmission lines. The first one of the pair of electrically coupled elements in the second one of the pair of transmission lines is coupled to a second one of the pair of output terminals of the time delay network.

In one embodiment, a transmission line transformer is provided having: a time delay network having a pair of output terminals connected to an input terminal through a corresponding one of a pair of time delay elements, each one of the time delay elements having a different time delay; and a transmission line section comprising a pair of transmission lines. Each one of the transmission lines includes a pair of electrically coupled elements, each one of the pair of electrically coupled elements having an input end and an output end. A first one of the electrically coupled elements in each one of the pair of transmission lines has the input end thereof connected to a corresponding one of the pair of output terminals of the network. The first one of the electrically coupled elements in the first one of the pair of transmission lines has the output end thereof connected to a first output terminal of the transmission line section. A second one of the electrically coupled elements in the first one of the transmission lines has the output end thereof connected to the output end of the first electrically coupled element of a second one of the pair of transmission lines. The output end of the second one of the electrically coupled elements in the second one of the transmission lines is connected to a second output terminal of the transmission line section. The time delay element of each one of the pair of time delay provides a different predetermined time delay selected to produce a voltage between the output end of the first one of the electrically coupled elements in the first one of the pair of transmission lines and output end of the second one of the pair of transmission lines equal to, and in phase with, a voltage produced between the output end of the first one of the electrically coupled elements in the second one pair of transmission lines and the output end of the second one of the electrically coupled elements in the second one of the pair of transmission lines.

In one embodiment, the network includes a pair of amplifiers, each one of the pair of amplifiers being serially connected to a corresponding one of the pair of time delay elements.

With such an arrangement, time delays are independently selected rather than distributing the input signal through equal delays to the transmission lines from a single port. Thus, to compensate the time delays in interconnecting the transmission lines on the output of the transmission line transformer, the transmission line transformer input side is driven through an independently selectable compensating time delay. More particularly, the inventors have recognized that with such an arrangement, time delays between interconnected transmission lines need not be minimized; but rather may be compensated for by the time delay network preceding the transmission line section. For example, during a calibration/testing or simulation procedure, after construction of the transmission line section with the outputs of the transmission lines thereof electrically interconnected one to the other, the requisite time delay from the first end of first one of the electrically coupled elements in each one of the pair of transmission lines to the outputs of the transmission line section is determined. Once determined, the time delay network is constructed with predetermined time delays selected in accordance with the time delay determined during the calibration/testing or simulation procedure.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
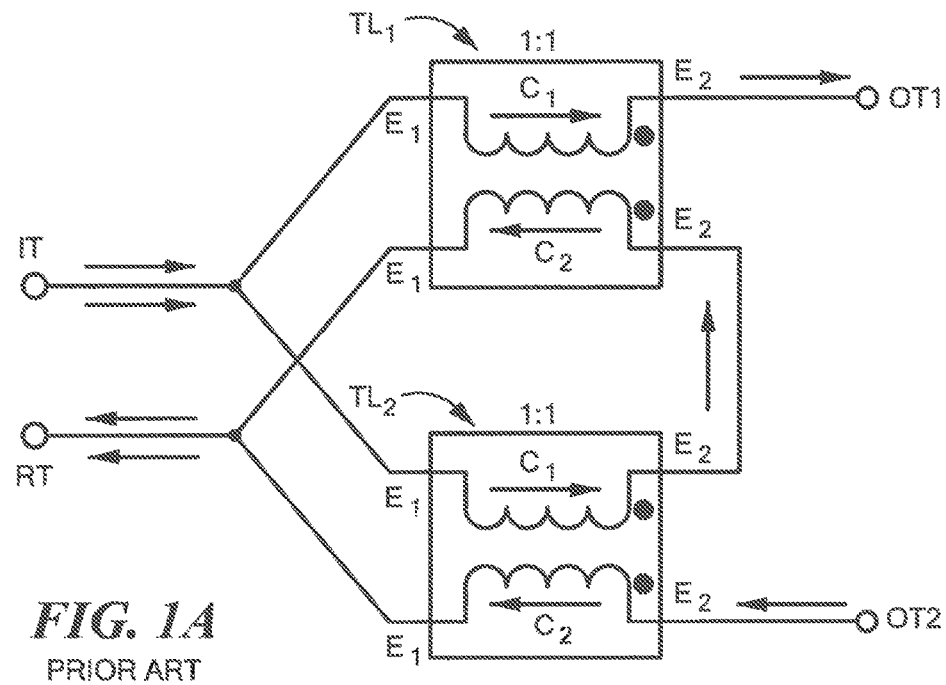
FIG. 1A is a schematic diagram of a building block used in a transmission line transformer, according to the PRIOR ART.
Figure 1B:
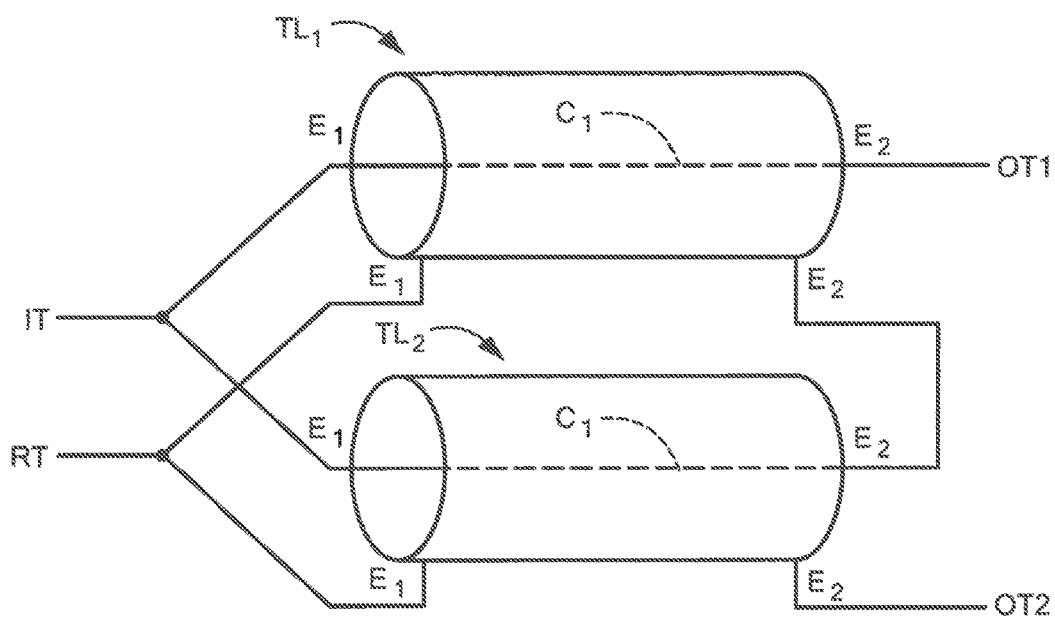
FIG. 1B is a schematic diagram of a building block used in a transmission line transformer with coaxial transmission lines, according to the PRIOR ART.
Figure 1C:
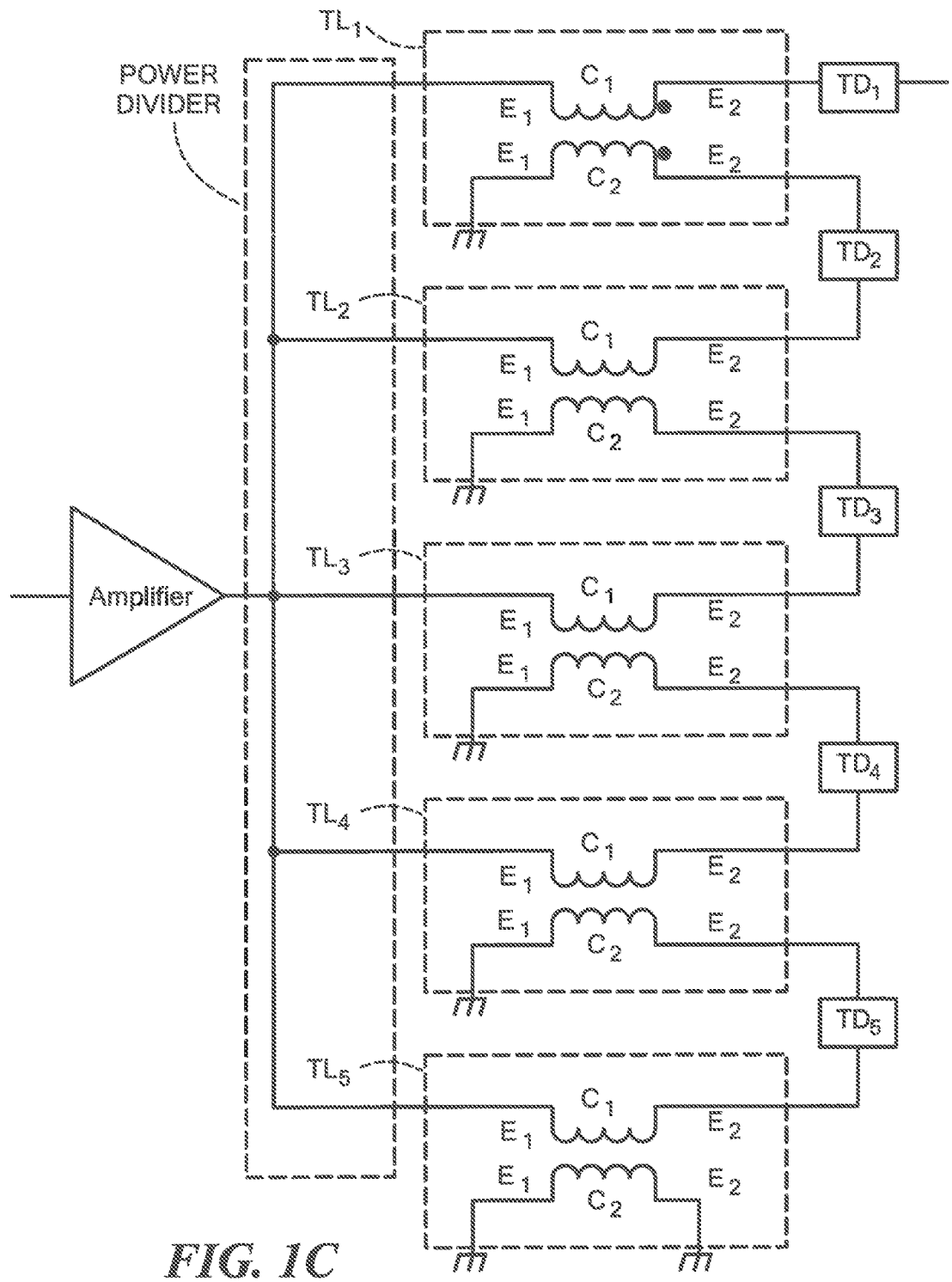
FIG. 1C is a schematic diagram of a 5:1 Guanella impedance transformer using the building block of FIG. 1A, according to the PRIOR ART.
Figure 1D:
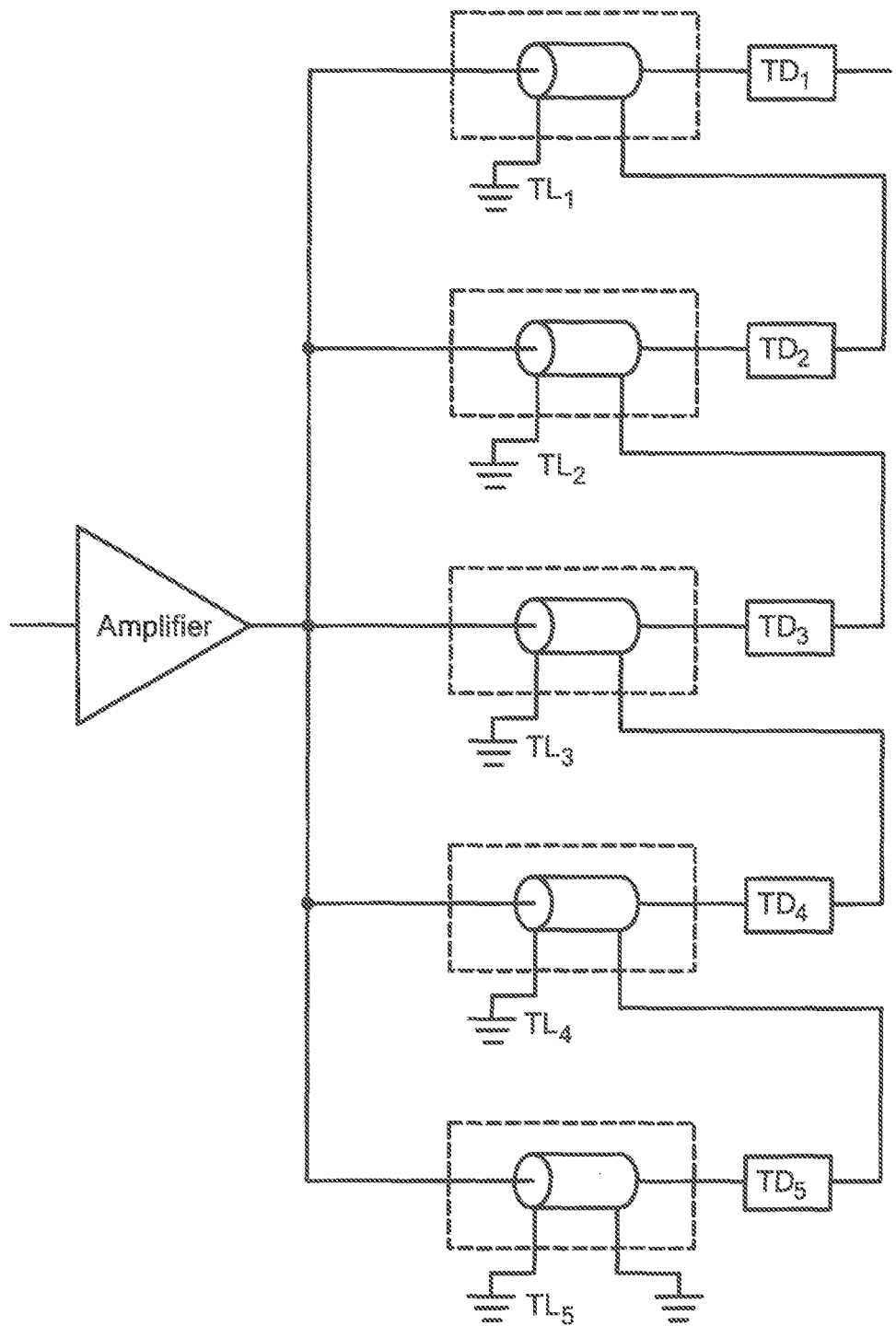
FIG. 1D is a schematic diagram of a 5:1 Guanella impedance transformer using the building block of FIG. 1B.
Figure 2:
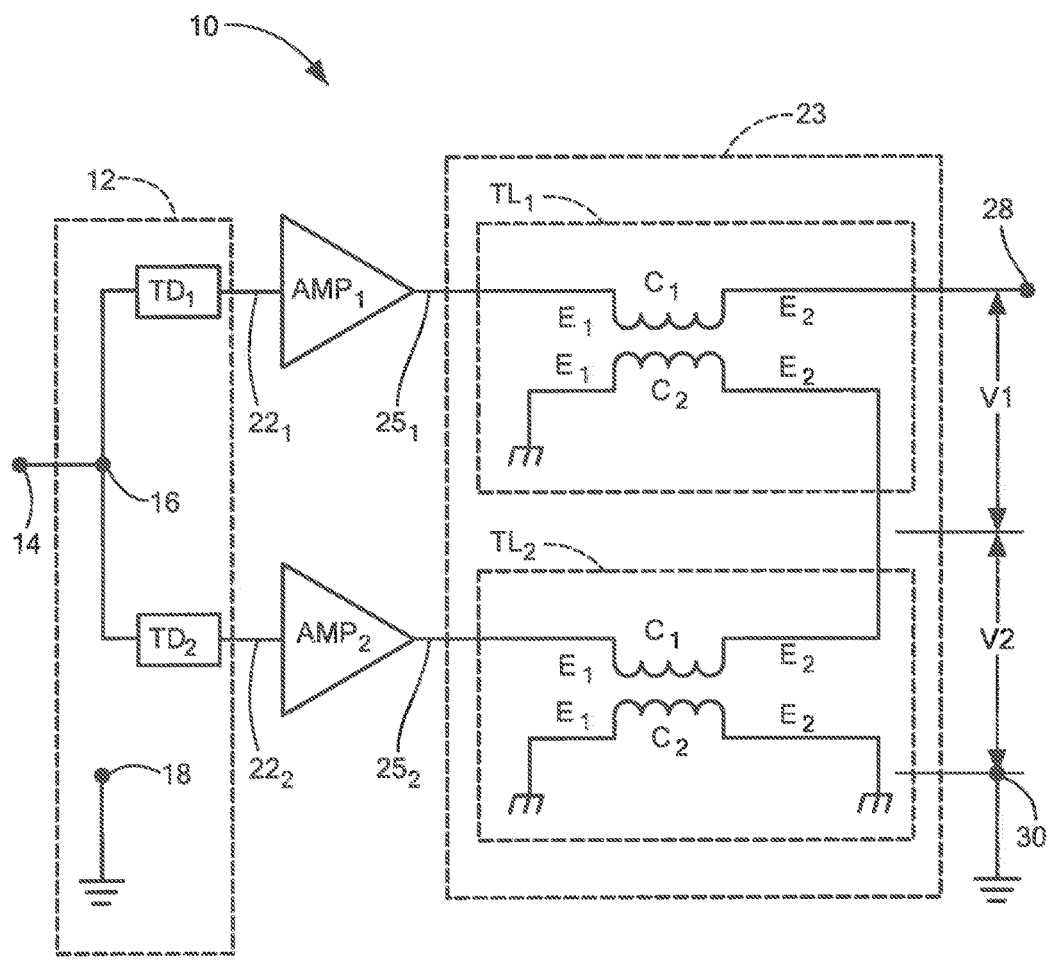
FIG. 2 is a schematic diagram of a building block used in a transmission line transformer, according to the disclosure.

Referring now to FIG. 2, a transmission line transformer 10 is shown having: a time delay network 12 connected to an input terminal 14. The time delay network 12 includes: a signal terminal 16 connected to the input terminal 14; a reference terminal 18, here system ground; and a pair of output terminals $22_1$, $22_2$, each one of the pair of output terminals $22_1$, $22_2$ being connected to the input terminal 16 through a corresponding one of a pair of time delay elements $TD_1$, $TD_2$, as shown. Each one of a pair of amplifiers $AMP_1$, $AMP_2$, is connected to a corresponding one of the pair of time delay elements $TD_1$, $TD_2$, as shown.

The transmission line transformer 10 includes a transmission line section 23 having a pair of input ports $25_1$, $25_2$ connected to the outputs of the pair of amplifiers $AMP_1$, $AMP_2$, respectively, as shown. The transmission line section 23 includes a pair of transmission lines, $TL_1$, $TL_2$ each one of the transmission lines $TL_1$, $TL_2$ having a pair of electrically coupled elements $C_1$, $C_2$, here shown as a pair of mutually coupled coils. A first one of the elements $C_1$ in a first one of the pair of the transmission lines, here transmission line $TL_1$ has a first end $E_1$ connected to a first one of the pair of output terminals $22_1$, $22_2$, here output terminal $22_1$ of the time delay line network 12 through amplifier $AMP_1$ and a second end $E_2$ coupled to output terminal 28 of the transmission line transformer 10. A second one of the elements $C_2$ in the first one of the pair of transmission lines $TL_1$ has a first end $E_1$ connected to the reference terminal and a second end $E_2$ connected to a second end $E_2$ of a first one of the pair of elements $C_1$ in a second one of the pair of transmission lines $TL_2$ through a connector 32, as shown. The first one of the pair of elements $C_1$ in the second one of the pair of transmission lines $TL_2$ is coupled to the one of the pair of output terminals $22_1$, $22_2$, here output terminal $22_2$ of the time delay network 12 through amplifier $AMP_2$, as shown. A second end $E_2$ of the second element $C_2$ of second one of the pair of transmission lines $TL_2$ is connected to output 30 of the transmission line transformer 10, here to system ground. A first end $E_1$ of the second element $C_2$ in the second one of the pair of transmission lines $TL_2$ is also connected to system ground, as indicated. A first end $E_1$ of the second element $C_2$ the second one of the pair of transmission lines $TL_2$ is connected to the system ground, as shown. The delay lines TD1 and TD2 are selected so that the voltage $V_1$ across the first transmission line $TL_1$ is equal to, and in phase with the voltage $V_2$ across the second transmission line $TL_2$. In that way, the output voltage across the output terminals 28, 30 equals $V_1+V_2$; where $V_1=V_2$. As a result, the input impedance $Z_0$ of the transmission line transformer 10 across terminals 25, 18 will be transformed to an output impedance $4Z_0$ across output terminals 28, 30.

Figure 3:
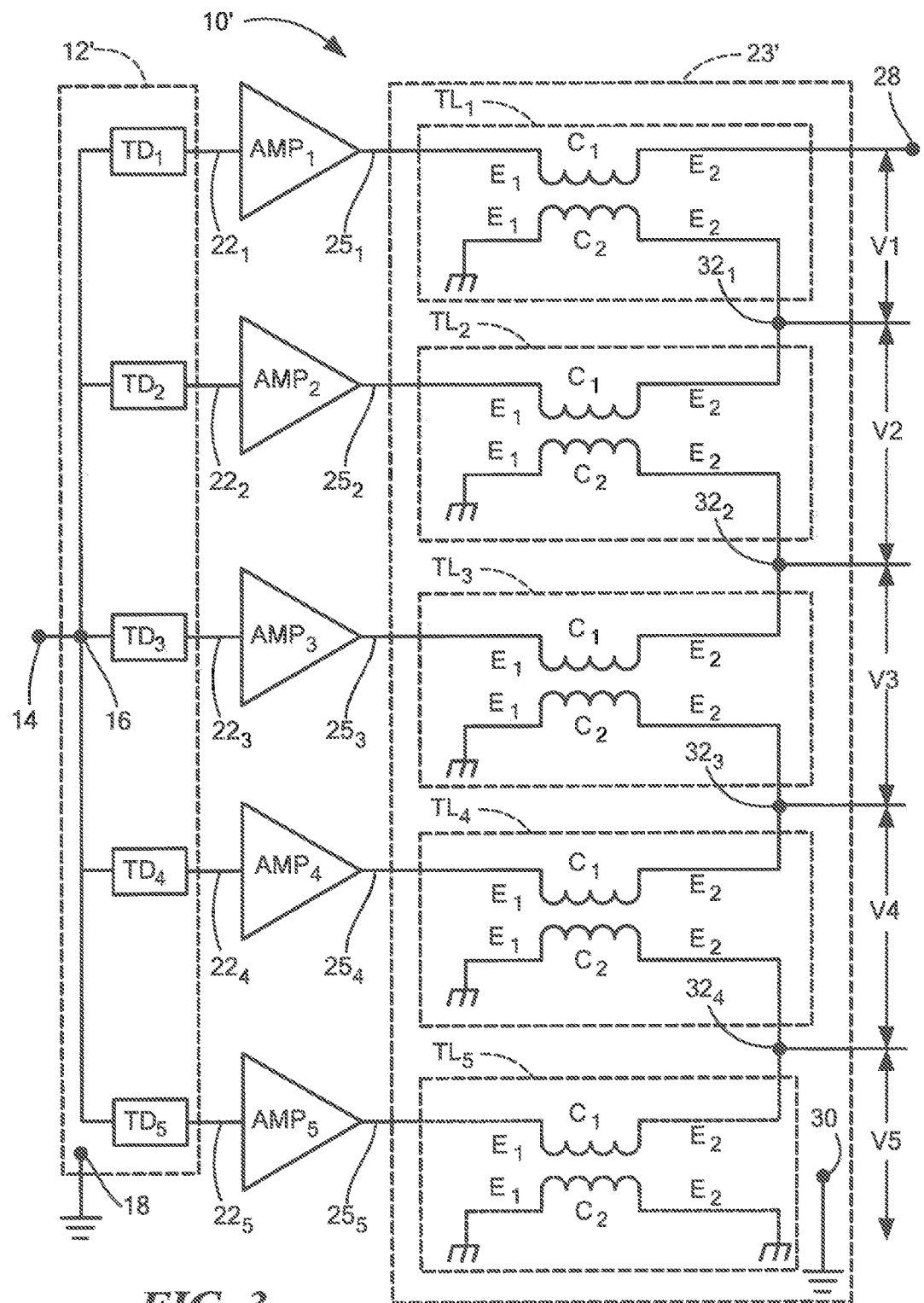
FIG. 3 is a schematic diagram of a 5:1 Guanella impedance transformer using the building block of FIG. 2, according to the disclosure.

Referring now to FIG. 3, a transmission line transformer 10' is shown here arranged as a 5:1 Guanella impedance transformer. The transmission line transformer 10' includes a time delay network 12'. The time delay network 12' includes: an first input terminal 14 connected to a signal terminal 16; a second input terminal 18 connected to a reference potential, here system ground; a plurality of N, where N is an integer greater than 1, here N=5 of time delay elements $TD_1$-$TD_5$; a plurality of N output terminals $22_1$-, $22_5$, respectively, each one of the five output terminals $22_1$-, $22_5$ being connected to the input terminal 16 through a corresponding one of the five time delay elements $TD_1$-$TD_5$, respectively, as shown. The output terminals $22_1$-, $22_5$ are connected to a corresponding one of five amplifiers $AMP_1$-$AMP_5$, respectively, as shown. The outputs of the amplifiers output terminals $25_1$-, $25_5$ are connected to a corresponding one of five amplifiers $AMP_1$ are connected to a transmission line section 23', here including five transmission lines, $TL_1$-$TL_5$ each one of the transmission lines $TL_1$-$TL_5$ having a pair of electrically coupled elements $C_1$, $C_2$, here shown as a pair of mutually coupled coils. More particularly, the upper one of coils, $C_1$, in each one of the transmission lines $TL_1$-$TL_5$ has a first, or input, end $E_1$ connected to one of the output of the amplifier and the lower one of the coils, $C_2$, in each one of the transmission lines $TL_1$-$TL_5$ has a first end $E_1$ connected to system ground. The second end, $E_2$, of the lower coil, $C_2$ in transmission line $TL_1$ is connected to a second end $E_2$ of the upper coil $C_1$ in the next one of the transmission lines, here transmission line $TL_2$ through a connector $32_1$; the second end, $E_2$, of the lower coil, $C_2$ in transmission line $TL_2$ is connected to a second end $E_2$ of the upper coil $C_1$ in the next one of transmission line, here transmission line $TL_3$ through a connector $32_2$; the second end, $E_2$, of the lower coil, $C_2$ in transmission line $TL_3$ is connected to a second end $E_2$ of the upper coil $C_1$ in the next one of the transmission line, here transmission line $TL_4$ through a connector $32_3$; the second end, $E_2$, of the lower coil, $C_2$ in transmission line $TL_4$ is connected to a second end $E_2$ of the upper coil $C_1$ in the next one of the transmission lines, here transmission line $TL_4$ through a connector $32_4$. The second end $E_2$ of the upper coil $C_1$ of transmission line $TL_1$ provides an output terminal of the Guanella impedance transformer and the second end $E_2$ of the lower coil $C_2$ of transmission line $TL_5$ is connected to output terminal 30, here at system ground, as shown. With such an arrangement, the voltage produced across the output terminals of each of the transmission lines, $TL_1$-$TL_5$ will be $V_1$-$V_5$, respectively, as indicated. The delay lines $TD_1$-$TD_5$ are selected so that the voltage $V_1$ across the first one of the transmission lines $TL_1$ is equal to, and in phase with the voltage $V_2$ across the second one of the transmission line $TL_2$; the voltage $V_3$ across the third transmission line $TL_3$ is equal to, and in phase with the voltage $V_2$ across the second transmission lines $TL_2$; the voltage $V_4$ across the fourth transmission lines $TL_4$ is equal to, and in phase with the voltage $V_3$ across the third transmission lines $TL_3$; the voltage $V_5$ across the fifth transmission lines $TL_5$ is equal to, and in phase with the voltage $V_4$ across the fourth transmission lines $TL_4$. In that way, the output voltage across the output terminals 28, 30 will equal $V_1+V_2+V_3+V_4+V_5$; where $V_1=V_2=V_3=V_4=V_5$, and the input impedance $Z_0$ of the transmission line transformer 10' across terminals 16, 18 will be transformed to an output impedance $25Z_0$ across output terminals 28, 30.

Figure 4:
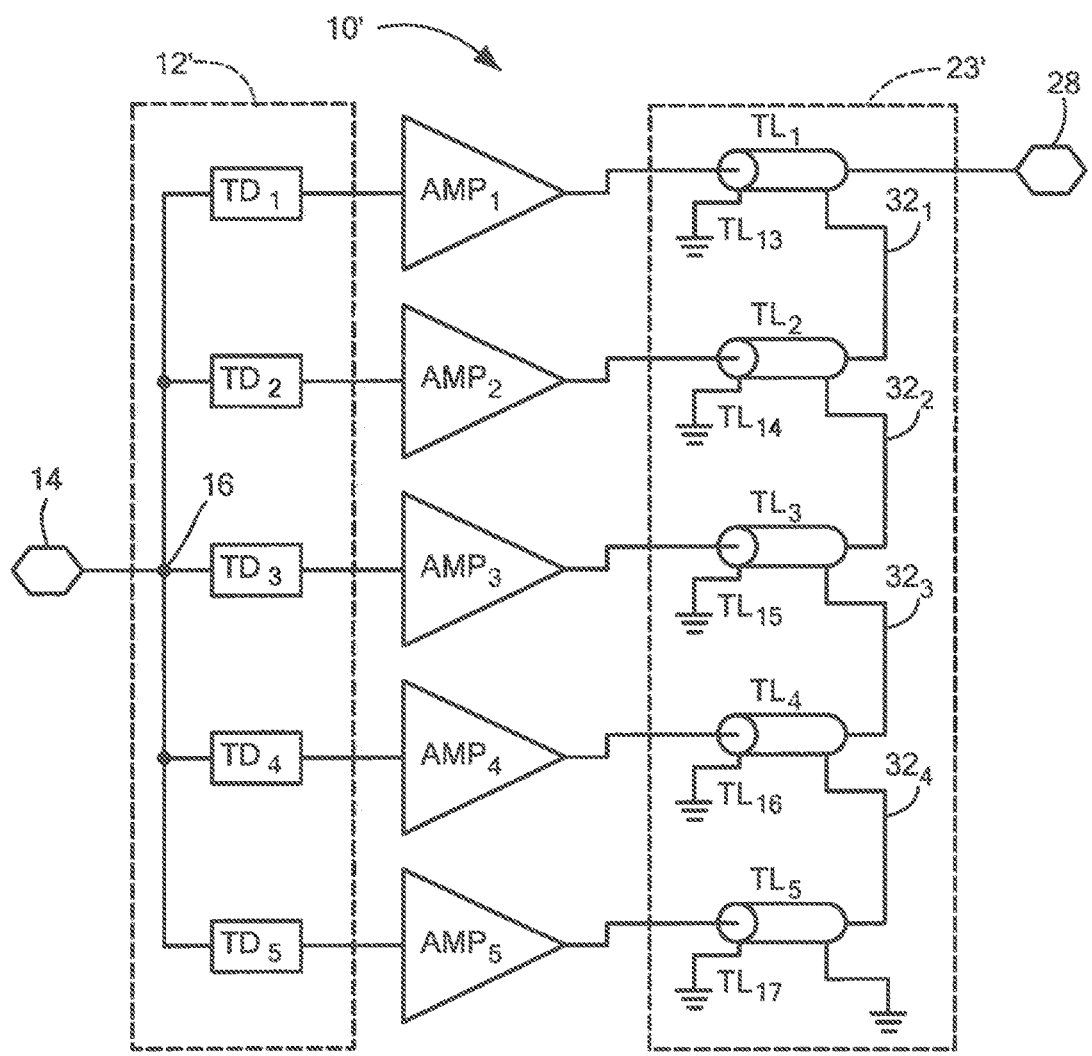
FIG. 4 is a schematic diagram of a 5:1 Guanella impedance transformer using the building block of FIG. 2 implemented with coaxial transmission lines, according to the disclosure.
Figure 5:
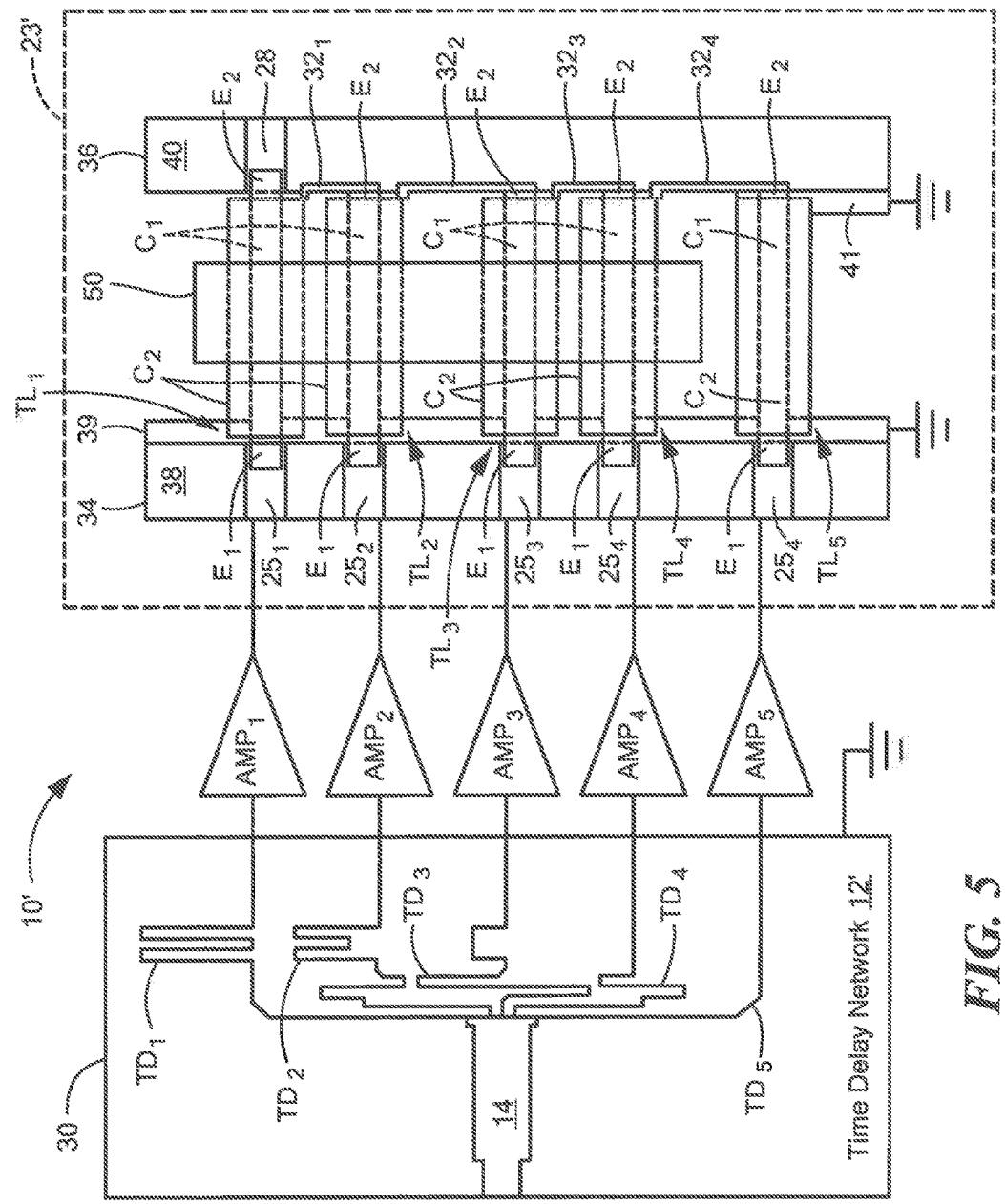
FIG. 5 is a diagrammatical plane view of the 5:1 Guanella impedance transformer of FIG. 4, according to the disclosure.

Referring to FIG. 4, here the transmission line transformer 10' of FIG. 3 is shown implemented with coaxial transmission line $TL_1$-$TL_5$. It is noted that the time delay elements $TD_1$-$TD_5$, may be placed either before or after the amplifiers $AMP_1$-$AMP_5$, respectively as indicated. A more detailed description of the transmission line transformer 10' of FIG. 5 is shown. Thus, as shown, the time delay network 12' is here a microstrip transmission line circuit having a dielectric board 30 having a ground plane conductor, not shown, on the bottom of the board 30 with a plurality of, here five strip conductors of different lengths to on the top of the board 30 to provide the five time delay elements $TD_1$-$TD_5$. The outputs of the five time delay elements $TD_1$-$TD_5$ are coupled to a corresponding one of the five amplifiers $AMP_1$-$AMP_5$, as shown. Here, each one of the five amplifiers $AMP_1$-$AMP_5$, is formed as a separate monolithic microwave integrated circuit (MMIC). That is, here each one of the five amplifiers $AMP_1$-$AMP_5$, is formed on a separate integrated circuit chip.

Figure 6:
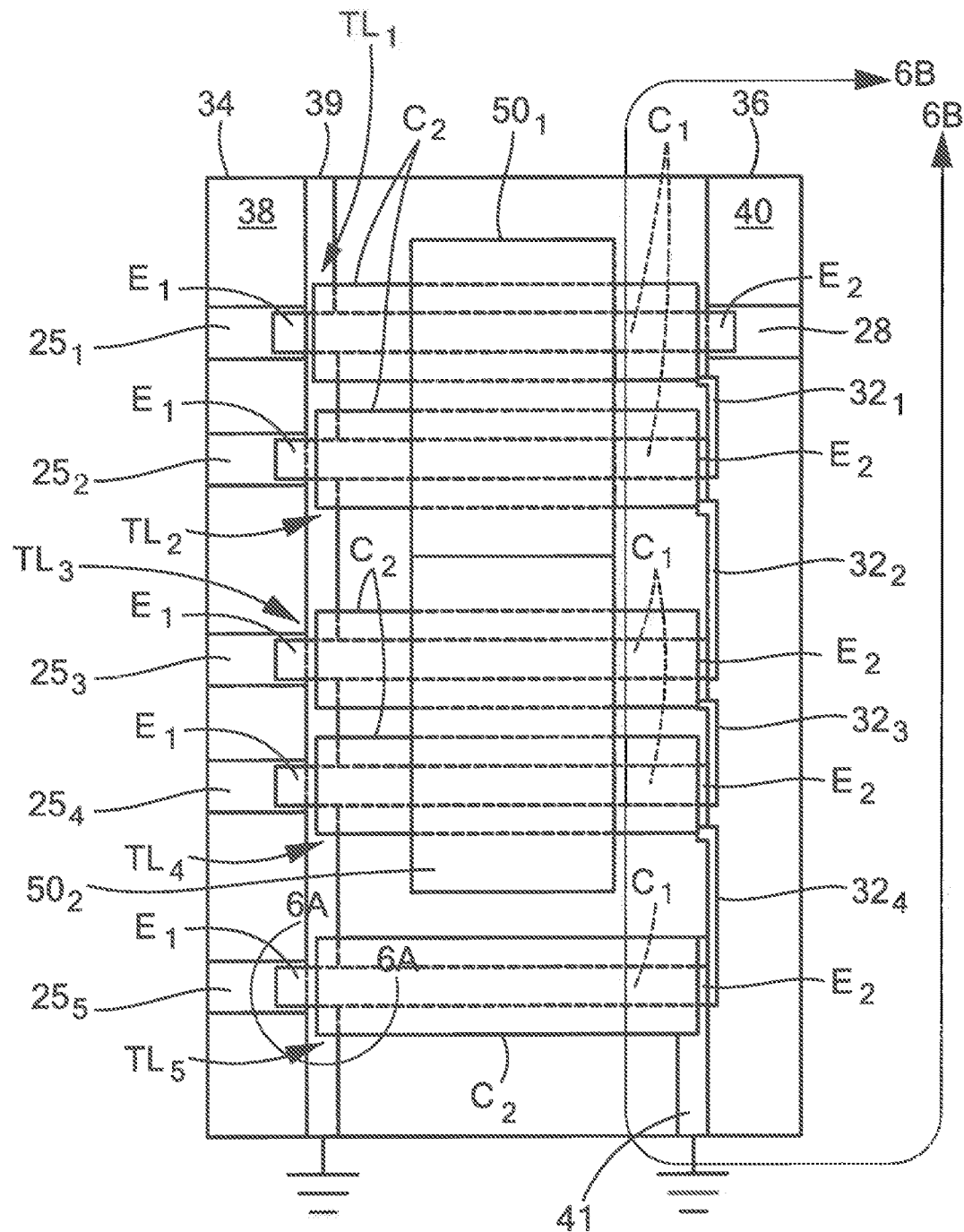
FIG. 6 is a diagrammatical plane view of a transmission line section used in the 5:1 Guanella impedance transformer of FIG. 5 according to the disclosure.

One method which may be used to determine the time delays TD1-TD5 is as follows: During a calibration/testing or simulation procedure, after construction of the transmission line section 23' with the outputs of the transmission lines TL1-TL5 electrically interconnected one to the other as shown and as described above, the requisite time delay from the first end E1 of first one of the electrically coupled elements C1 in each one of the transmission lines TL1-TL5 to the output 28 of the transmission line section 23' is determined. Once determined, the time delay network 30 is constructed with the time delays TD1-TD5 having a proper physical length such that the time delays produce predetermined time delays determined during the calibration/testing procedure. It is noted that time delays TD1-TD5 here, in this example, have different electrical lengths; however, the electrical lengths from the input port 14 to the first ends E1 of the first elements C1 of the transmission lines TL1-TL5 are proper to produce the proper output voltage across the output terminals 28, 30; that is $V_1+V_2+V_3+V_4+V_5$; where $V_1=V_2=V_3=V_4=V_5$, as shown in FIG. 3. The outputs of the five amplifiers $AMP_1$-$AMP_5$ are fed to the transmission line section 23'. The transmission line section 23', shown in more detail in FIGS. 6 and 6A, includes a pair of microstrip transmission line sections 34, 36. Microstrip transmission line section 34 includes a dielectric board 38 having a ground plane conductor, not shown, on the bottom of the board 38, a plurality strip conductors on the top of the board 38 to provide the input ports $25_1$-$25_5$, and a conductor 39 which is connected to a ground plane conductor 54 which extends from the bottom of the board 38. Microstrip transmission line section 36 includes a dielectric board 40 having a ground plane conductor, not shown, on the bottom of the board 40 with two strip conductor layers, one on the top of the board 40 and one embedded in board 40. The top layer provides output port 28.

Figure 6A:
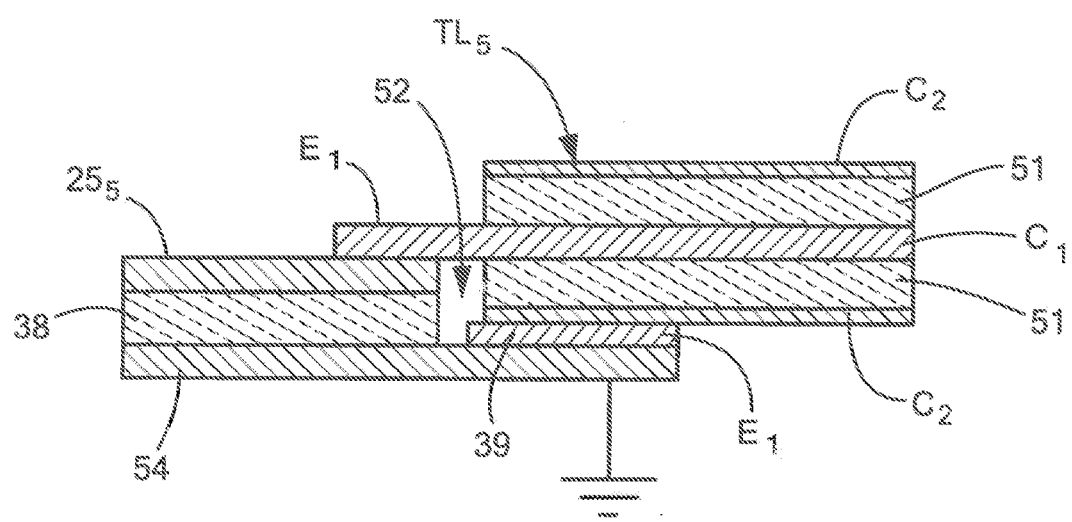
FIG. 6A is a cross sectional sketch of an enlarged portion of the transmission line section of FIG. 6, such enlarged portion being indicated by a circled region labeled 6A-6A in FIG. 6 according to the disclosure.

Disposed between the pair of microstrip transmission line sections 34, 36 are the transmission lines $TL_1$-$TL_5$, here each one being a coaxial transmission line having a pair of coupling elements. $C_1$, $C_2$, element $C_1$ being the inner conductor of the coaxial transmission line and element $C_2$ being the outer conductor of the coaxial transmission line. Each one of the first ends $E_1$ of the elements $C_1$ is connected to a corresponding one of the input ports $25_1$-$25_5$, and each one of the first ends $E_1$ of the elements $C_2$ is connect to the conductor 39. It is noted that the conductor 39 is electrically isolated from the input ports $25_1$-$25_5$ by the dielectric board 38, as shown more clearly in FIGS. 6 and 6A, where FIG. 6A shows an exemplary one of the transmission lines $TL_1$-$TL_5$, here transmission line $TL_5$. The second end $E_2$ of coupling elements $C_1$ of transmission line $TL_1$ is connected to output port 28, as shown. The second end $E_2$ of coupling elements $C_2$ of transmission line $TL_1$ is connected to the second end $E_2$ of coupling element $C_1$ of transmission line $TL_2$ by a conductor $32_1$ disposed on the dielectric board 40. The second end $E_2$ of coupling elements $C_2$ of transmission line $TL_2$ is connected to the second end $E_2$ of coupling element $C_1$ of transmission line $TL_3$ by a conductor $32_2$ disposed on the dielectric board 40. The second end $E_2$ of coupling elements $C_2$ of transmission line $TL_3$ is connected to the second end $E_2$ of coupling element $C_1$ of transmission line $TL_4$ by a conductor $32_3$ disposed on the dielectric board 40. The second end $E_2$ of coupling elements $C_2$ of transmission line $TL_4$ is connected to the second end $E_2$ of coupling element $C_1$ of transmission line $TL_5$ by a conductor $32_4$ disposed on the dielectric board 40. The second end $E_2$ of coupling elements $C_2$ of transmission line $TL_5$ is connected to a conductor 41 on the top of dielectric 40; the conductor 41 being electrically isolated from output port 28, and the conductors $32_1$-$32_4$ by portions of the dielectric board 40. Conductors 39 and 41 are both connected to system ground. Here, the transmission lines $TL_1$ and $TL_2$ are disposed within a hollow ferrite core $50_1$ and transmission lines $TL_3$ and $TL_4$ are disposed within a hollow ferrite core $50_2$, as shown.

FIG. 6A shows the first end E1 of the coupling elements $C_1$ and $C_2$ of an exemplary one of the transmission lines $TL_1$-$TL_5$, here transmission line $TL_5$. The first end E1 of coupling element $C_1$, here the center conductor of the coaxial conductor of transmission line $TL_5$ is connected input port $25_5$ of the transmission line section 23' and the first end E1 of the coupling element $C_2$, here the outer conductor of the coaxial conductor of $TL_5$ is connected to conductor 54 on dielectrics board 38. It is noted that the center conductor, coupling element C1 is physically separated by a dielectric 51 from the coupling element $C_2$; however at microwave frequencies the center conductor coupling element $C_1$ and outer conductor coupling element $C_2$ are electrically coupled by the electric field of the microwave energy passing through the coaxial transmission line. It is noted that the conductor 39 is electrically isolated from the port $25_5$ by region 52. It is also noted that the ground plane conductor on the bottom of dielectric 38, mention above, is here shown as conductor 54 and is connected to conductor 39.

Figure 6B:
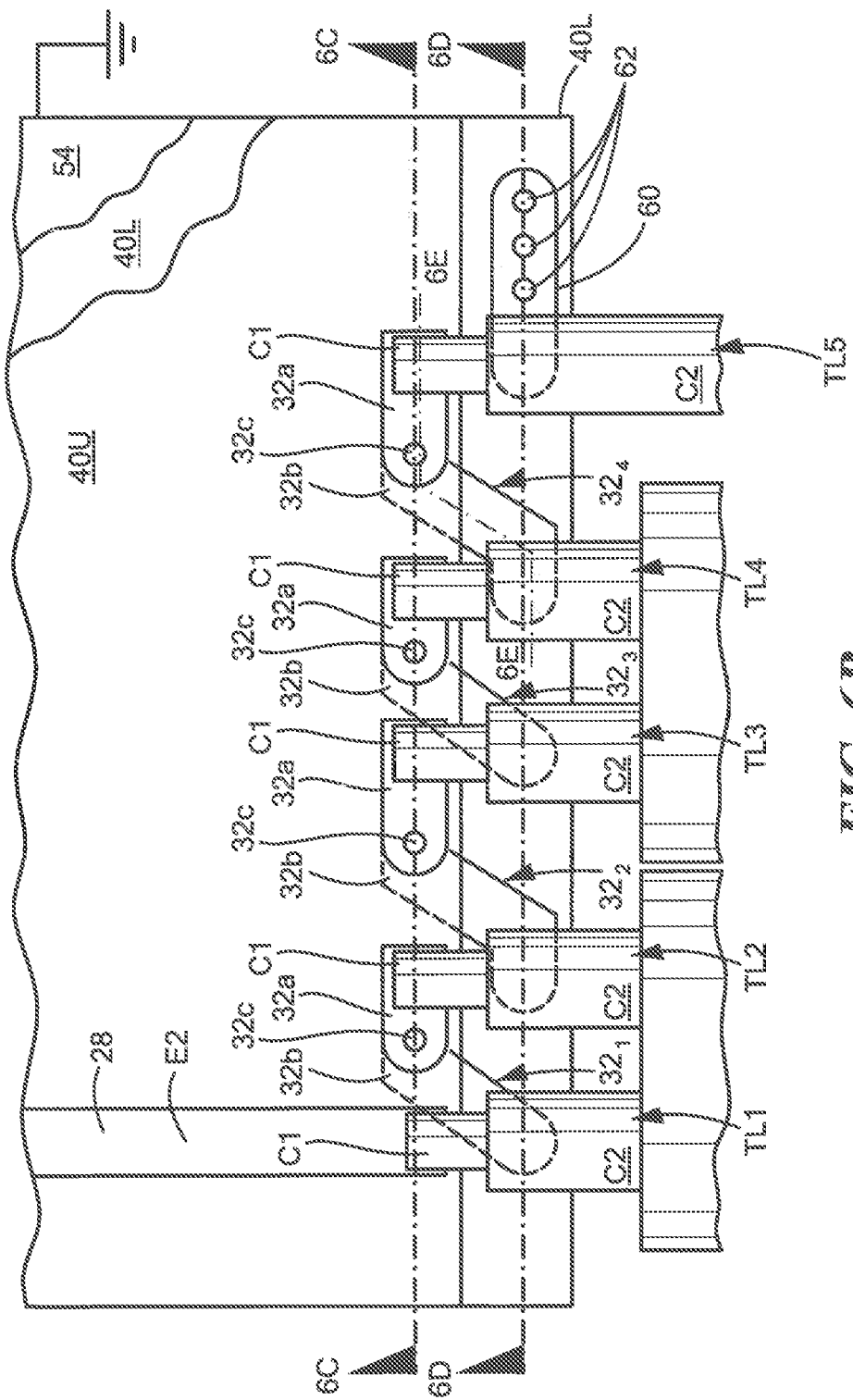
FIG. 6B is a plan view of an enlarged portion of the transmission line section of FIG. 6, such enlarged portion being indicated by a circled region labeled 6B-6B in FIG. 6 according to the disclosure.
Figure 6C:
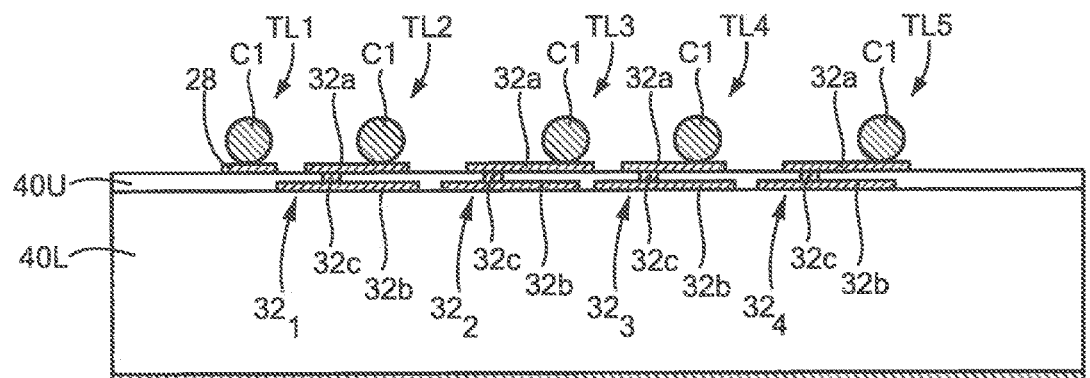
FIGS. 6C-6E are cross-sectional views of enlarged portions of the transmission line section of FIG. 6, such cross sections being taken along lines 6C-6C, 6D-6D and 6E-6E, respectively in FIG. 6.
Figure 6D:
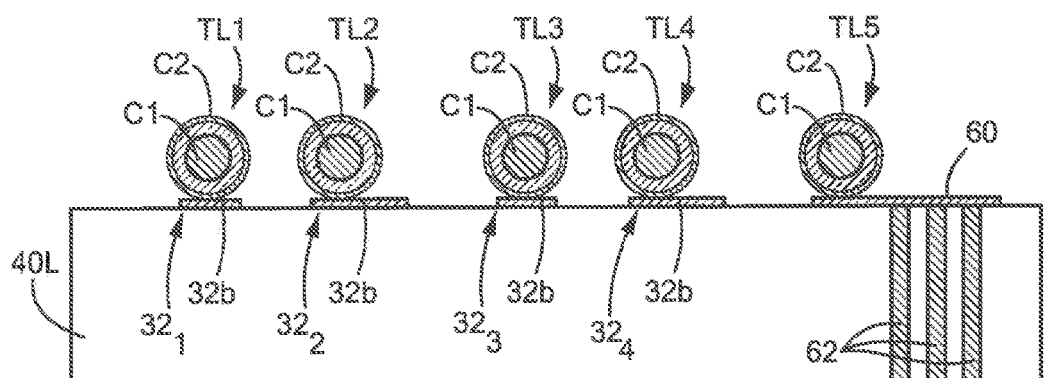
Figure 6E:
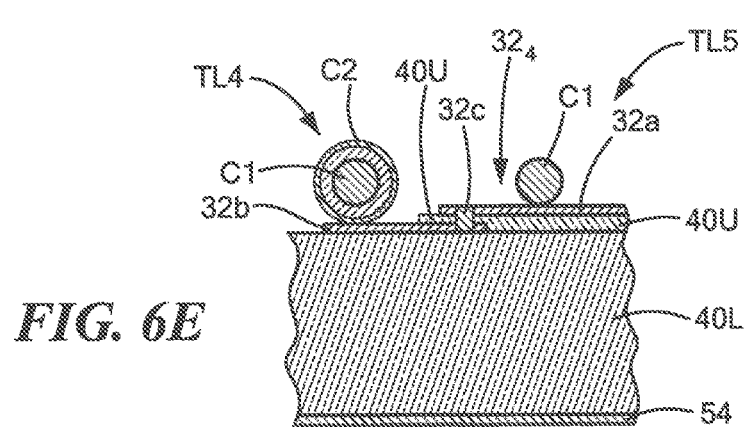

More details of the connections of the center conductor coupling elements C1 to the outer conductor coupling element $C_2$ of the transmission lines TL1-TL5 are shown in FIGS. 6B through 6E. It is first noted that because the center conductor coupling elements C1 and the outer conductor coupling element C$_2$ are at two different elevations; the a dielectric board 40 is constructed has an upper portion 40U and a lower portion 40L as indicated in FIG. 6B and that the connectors 32$_1$-32$_4$ each has two sections 32a, 32b; section 32a being on top of board 40U and section 32b being on board 40L, the two sections 32a and 32b being electrically connected by conductive vias 32c, as shown more clearly in FIG. 6E. Thus, sections 32a are connected to the center conductor coupling elements C1; sections 32b are connected to the outer conductor coupling element C$_2$ and the two are electrically connected by the conductive vias 32c. Also the outer conductor coupling element C$_2$ of transmission line TL5 is connected to the ground plane conductor 54 through a conductor 60 and conductive vias 62, as shown in FIG. 6D.

Figure 7:
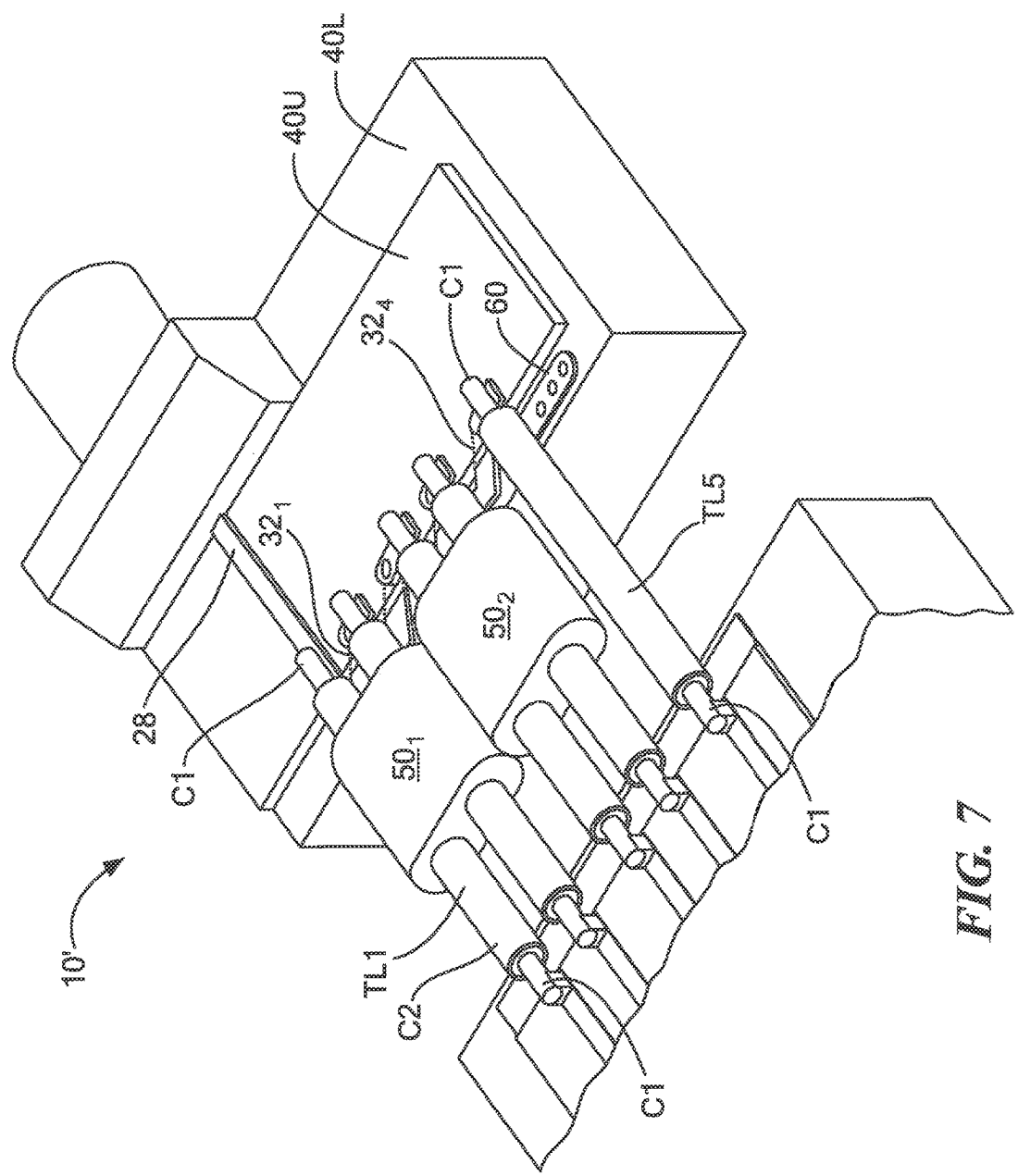
FIG. 7 is an isometric sketch of the transmission line section of FIG. 6 according to the disclosure.

FIG. 7 is an isometric view of the transmission line transformer 10.

A number of embodiments of the disclosure have been described. Nevertheless, it will be understood that various modifications may be made without departing from the spirit and scope of the disclosure. For example, in some applications, the ferrite cores need not be required. Further, the number of transmission line sections may be greater or less than 5. Accordingly, other embodiments are within the scope of the following claims.

What is claimed is:

1. A transmission line transformer, comprising:
   a time delay network having a pair of output terminals connected to an input terminal through a corresponding one of a pair of time delay elements, the delay line elements having different time delays;
   a transmission line section comprising a pair of transmission lines, each one of the transmission lines having a pair of electrically coupled elements, a first one of the electrically coupled elements in each one of the pair of transmission lines having a first end connected to a corresponding one of the pair of output terminals of the time delay network, a second one of the electrically coupled elements in a first one of the transmission lines having a second end connected to a second end of the first one of the pair of electrically coupled elements in a second one of the pair of transmission lines; and
   wherein the time delay element of each one of the pair of time delay provides a predetermined time delay selected to produce:
      a voltage between the output end of the first one of the electrically coupled elements in the first one of the pair of transmission lines and output end of the second one of the pair of transmission lines equal to, and in phase with, a voltage produced between the output end of the first one of the electrically coupled elements in the second one pair of transmission lines and the output end of the second one of the electrically coupled elements in the second one of the pair of transmission lines.

2. The transmission line transformer recited in claim 1 wherein a second end of the first electrically coupled element of said first of the pair of transmission lines is connected to an output of the transmission line transformer.

3. The transmission line transformer recited in claim 2 wherein one end of the second electrically coupled element in said second one of the pair of transmission lines is connected to a reference terminal of the transmission line transformer.

4. The transmission line transformer recited in claim 3 wherein a first end of the second electrically coupled element in said first of the pair of transmission lines is connected to the reference terminal.

5. The transmission line transformer recited in claim 4 wherein a first end of the second electrically coupled element in said first one of the transmission lines is connected to the reference terminal.

6. A transmission line transformer, comprising:
   a time delay network having: an first input terminal connected to a signal terminal; a second input terminal connected to a reference terminal; and a pair of output terminals, each one of the pair of output terminals being connected to the input terminal through a corresponding one of a pair of time delay elements, the delay line elements having different time delays;
   a pair of transmission lines, each one of the transmission lines having a pair of electrically coupled elements;
   wherein a first one of the electrically coupled elements in a first one of the pair of the transmission lines has a first end connected to a first one of the pair of output terminals of the time delay line network and a second end coupled to a first one of the output terminals of the transmission line transformer;
   wherein a second one of the electrically coupled elements in the first one of the pair of transmission lines has a first end connected to the reference terminal and a second end connected to a second end of a first one of the pair of electrically coupled elements in a second one of the pair of transmission lines; and
   wherein the first one of the pair of electrically coupled elements in the second one of the pair of transmission lines is coupled to a second one of the pair of output terminals of the time delay network; and
   wherein the time delay element of each one of the pair of time delay provides a predetermined time delay selected to produce:
      a voltage between the output end of the first one of the electrically coupled elements in the first one of the pair of transmission lines and output end of the second one of the pair of transmission lines equal to, and in phase with, a voltage produced between the output end of the first one of the electrically coupled elements in the second one pair of transmission lines and the output end of the second one of the electrically coupled elements in the second one of the pair of transmission lines.

7. A transmission line transformer, comprising:
   a time delay network having a pair of output terminals connected to an input terminal through a corresponding one of a pair of time delay elements, the delay line elements having different time delays;
   a transmission line section comprising a pair of transmission lines, each one of the transmission lines having:
      a pair of electrically coupled elements, each one of the pair of electrically coupled elements having an input end and an output end;
      wherein:
         a first one of the electrically coupled elements in each one of the pair of transmission lines has the input end thereof connected to a corresponding one of the pair of output terminals of the network;
         the first one of the electrically coupled elements in the first one of the pair of transmission lines has the output end thereof connected to a first output terminal of the transmission line section;
         a second one of the electrically coupled elements in the first one of the transmission lines has the output end thereof connected to the output end of the first electrically coupled element of a second one of the pair of transmission lines; and the output end of the second one of the electrically coupled elements in the second one of the transmission lines is connected to a second output terminal of the transmission line section; and wherein the time delay element of each one of the pair of time delay provides a predetermined time delay selected to produce:

a voltage between the output end of the first one of the electrically coupled elements in the first one of the pair of transmission lines and output end of the second one of the pair of transmission lines equal to, and in phase with, a voltage produced between the output end of the first one of the electrically coupled elements in the second one pair of transmission lines and the output end of the second one of the electrically coupled elements in the second one of the pair of transmission lines.

8. The transmission line transformer recited in claim 7 wherein the network includes a pair of amplifiers, each one of the pair of amplifiers being serially connected to a corresponding one of the pair of time delay elements.

9. The transmission line transformer recited in claim 7 wherein each one of the each one of the transmission lines is a coaxial transmission line having a center conductor and an outer conductor, and; including a dielectric structure having a upper portion disposed above a lower portion, with an electrical connector on the upper portion and an electrical connector on the lower portion electrically interconnected with an electrically conductive via passing though the upper portion, and wherein the electrical connector on the upper portion is electrically connected to the center conductor of one coaxial transmission line and the electrical connector on the lower portion is electrically connected to the outer conductor of another coaxial transmission line.

\* \* \* \* \*